United States Patent [19]

Kurth et al.

[11] 4,167,644
[45] Sep. 11, 1979

[54] SOLAR CELL MODULE

[75] Inventors: William T. Kurth, South Hamilton; Steven G. Miles, North Billerica, both of Mass.

[73] Assignee: Exxon Research & Engineering Co., Florham Park, N.J.

[21] Appl. No.: 947,018

[22] Filed: Sep. 29, 1978

[51] Int. Cl.² .................................. H01L 31/04
[52] U.S. Cl. .................................... 136/89 EP
[58] Field of Search ............ 136/89 EP, 89 P, 89 CA

[56] References Cited

U.S. PATENT DOCUMENTS

| 2,739,011 | 3/1956 | Thomson | 296/84 |
| 3,268,366 | 8/1966 | Guyot | 136/89 |
| 3,376,164 | 4/1968 | Bachwansky | 136/89 |
| 3,982,963 | 9/1976 | Mahoney et al. | 136/89 |
| 4,045,245 | 8/1977 | Coleman et al. | 136/89 |
| 4,097,308 | 6/1978 | Klein et al. | 136/89 H |

OTHER PUBLICATIONS

Optical Coating Laboratory, Inc., Product Literature—20 Watt Terrestrial Solar Module, Part No. 60-3017, (1978).

Amperex Electronic Corporation, Product Literature, Terrestrial Solar Module, Type BPX 47A, (Apr. 1978).

Primary Examiner—Aaron Weisstuch
Attorney, Agent, or Firm—Joseph J. Dvorak

[57] ABSTRACT

A solar cell module consisting of a solar cell panel and a frame therefor is disclosed. The solar cell panel is formed from a hard, light transparent sheet material which preferably is glass and has arrayed on the bottom surface of the glass a plurality of individual solar cells interconnected in the requisite series and/or parallel circuit arrangement. The cells are bonded permanently to the underside of the panel by suitable bonding means such as a silicon adhesive. The rear surface of the solar cells and glass is covered with a suitable material, preferably with a light transparent elastomer, to protect the cells from the elements, thereby preventing corrosion of the electrical contacts. The frame extends around the perimeter of the solar panel and has at least one top flange that is essentially coplanar with the solar panel for supporting engagement with a setting strip of resilient material. The setting strip has parts embracing the flange and the marginal edge of the solar cell panel.

12 Claims, 5 Drawing Figures

SOLAR CELL MODULE

BACKGROUND OF THE INVENTION

1. Field of the Invention

The present invention relates to solar cell modules. More particularly, the present invention relates to new and useful improvements in mounting solar cell panels in modular fashion.

2. Brief Description of the Prior Art

Various types of solar panels are known in the art. In general, these solar panels comprise a plurality of individual solar cells arranged in columns and rows and supported by a rigid support material. Each cell, of course, is provided with interconnects so as to connect the cells in the requisite series and/or parallel circuit arrangement so that all of the current generated by the individual cells is collected to provide the desired voltage and short circuit current for the panel. The arrayed cells are also provided with a protective coating to avoid damage to the solar cells from environmental hazards.

One known solar panel for terrestrial use includes a plurality of individual electrically connected solar cells mounted on a printed circuit board and soldered thereto. The cells are encased in a transparent plastic such as silicone rubber and are covered with an impact resistant light transparent polycarbonate plate. The panels are mounted on a frame which is adapted for securing the assembly of panel and frame to an appropriate mounting surface for proper angular orientation of the panel for interception of solar radiation.

In yet another known solar cell panel, the solar cells are arrayed on the bottom surface of a rigid, light transparent panel. This light transparent panel thereby serves both as the protection for the solar cells against environmental hazards and also as the support structure or superstrate. The cells and the interconnect means are encapsulated by means of a silicon rubber backing layer, for example. Typically, this type of panel is fitted into a metal frame which provides additional mechanical strength and means for mounting the modules in the field for actual use.

These prior art techniques have not been without problems. Clearly, the modules will always be subjected to thermomechanical stresses due to the different materials employed in the panel and the frame. Additionally, these prior art techniques do not permit the facile installation and removal of the panels from the frame, especially in the field, without removal or altering of the frame. Other deficiencies, too, are known.

SUMMARY OF THE INVENTION

Briefly stated, the present invention contemplates an improved solar cell module having a solar cell panel and a frame therefor. The solar cell panel is formed from a hard, light transparent sheet material which preferably is glass and has arrayed on the bottom surface of the glass a plurality of individual solar cells interconnected in the requisite series and/or parallel circuit arrangement. The cells are bonded permanently to the underside of the panel by suitable bonding means such as a silicon adhesive. The rear surface of the solar cells and glass is covered with a suitable material, preferably with a light transparent elastomer, to protect the cells from the elements, thereby preventing corrosion of the electrical contacts. The frame extends around the perimeter of the solar panel and has at least one top flange that is essentially coplanar with the solar panel for supporting engagement with a setting strip of resilient material. The setting strip has parts embracing the flange and the marginal edge of the solar cell panel.

The advantages and other features of the invention will be apparent from the specification which follows and from the drawings wherein like numerals are used throughout to identify like parts.

DETAILED DESCRIPTION OF THE INVENTION

Figure 1:
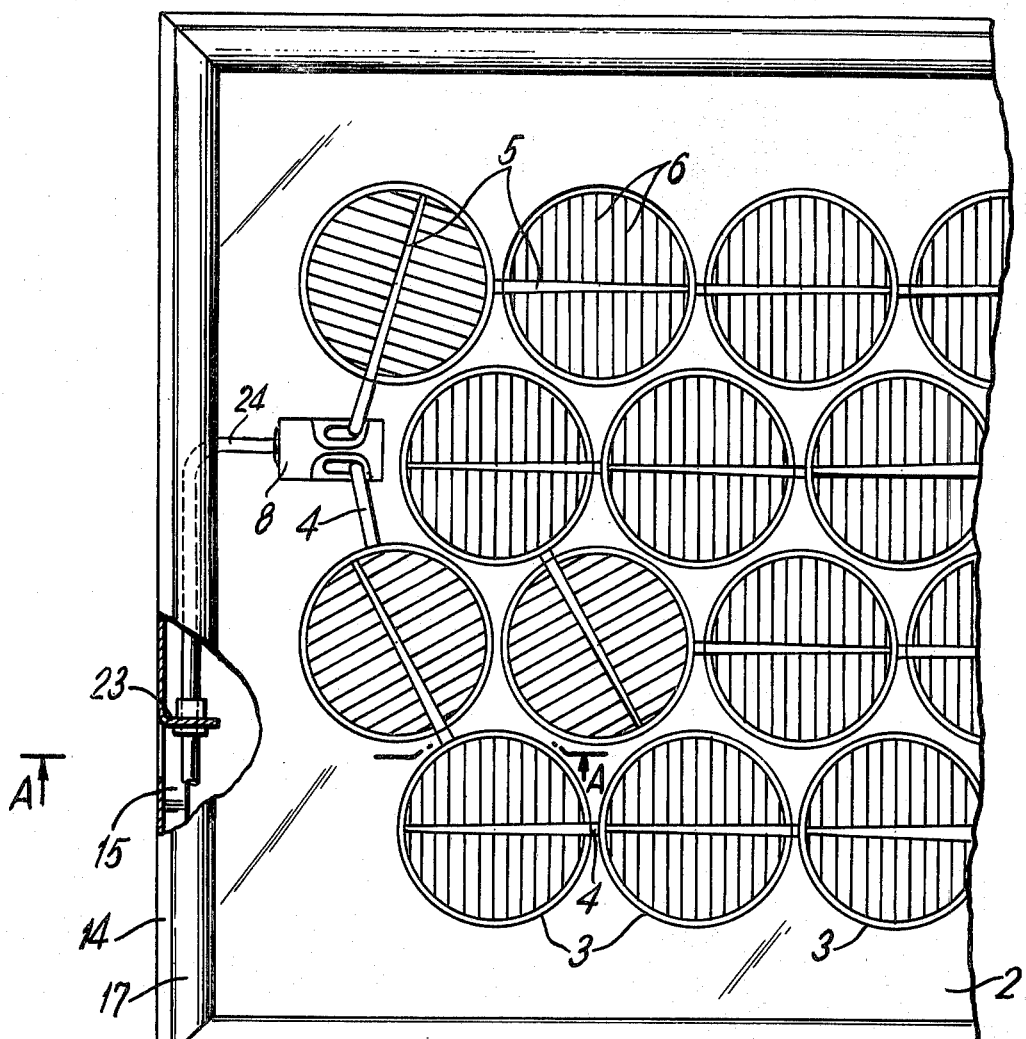
FIG. 1 is a fragmentary top plan view of a solar cell module embodying this invention, parts thereof being broken away and shown in section for clearness of illustration.

Referring in general to FIGS. 1 to 5 and in particular to FIG. 1, there is shown a solar cell support structure or superstrate 2 which is in the shape of a flat panel and is formed from a rigid, light transparent electrically nonconductive material such as glass and plastics. Suitable plastics include polyacrylates, such as polymethacrylate, and polycarbonates. Preferably, however, the support structure 2 is a sheet of iron-free tempered glass.

As is shown in FIG. 1, the support structure 2 is generally and preferably rectangular in shape. Typical dimensions for the support are 44 inches long by 15 inches wide by $\frac{1}{8}$ inch thick.

Located on the bottom surface of support structure 2 or superstrate are a plurality of solar cells 3. The solar cells 3 are fixed permanently to the underside of the support structure 2 by use of well-known bonding techniques such as the use of light transparent elastomeric adhesives such as silicone rubbers and polyurethane materials like those sold under the trade name GE108 by General Electric Company, New York, and Desmophere 651A-65 by Mobay Chemical Company, Pennsylvania, respectively, and by well-known diffusion bonding techniques.

As can be seen from FIG. 1, the solar cells 3 are shown connected, in this instance, in series by means of flexible interconnectors 4. Thus, the electrode on the bottom of one solar cell 3 is connected via flexible interconnector 4 to the top bus bar 5 of the next succeeding solar cell 3. The bus bars 5 connect the electrically conductive fingers 6 on the top surface of the solar cells. Additionally, the flexible interconnectors 4 provide for electric contact with termination posts 31 (FIG. 3).

Figure 2:
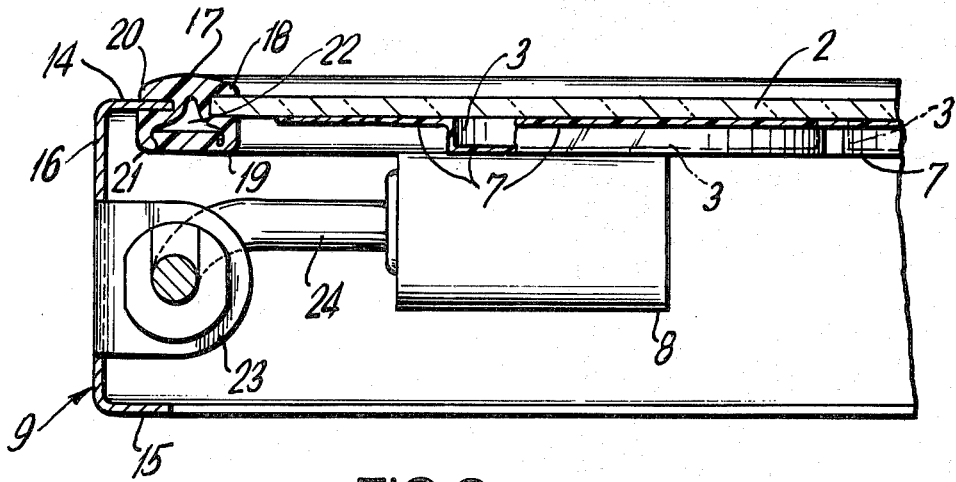
FIG. 2 is a fragmentary side elevation taken along lines A—A of FIG. 1.
Figure 3:
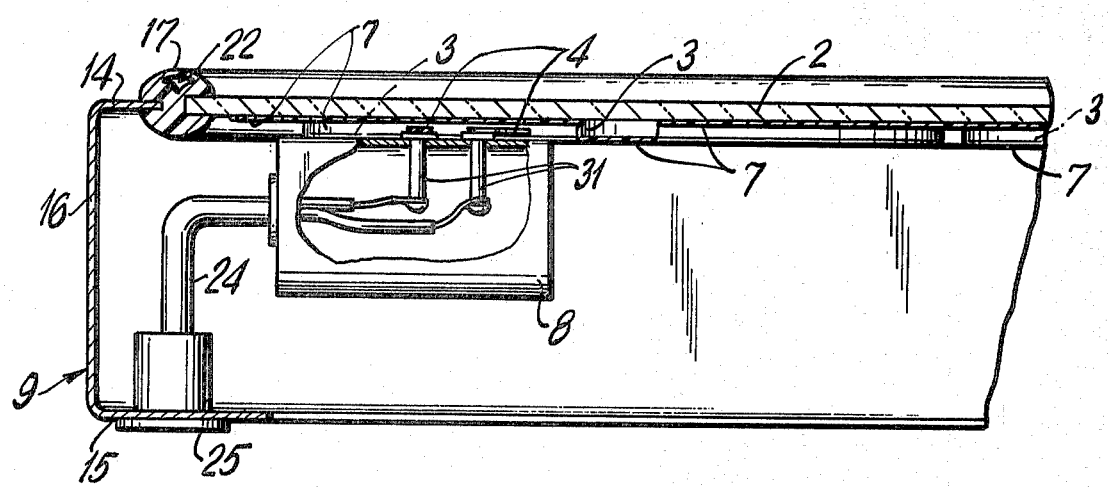
FIG. 3 is a fragmentary side elevation of an alternate embodiment of the present invention.
Figure 4:
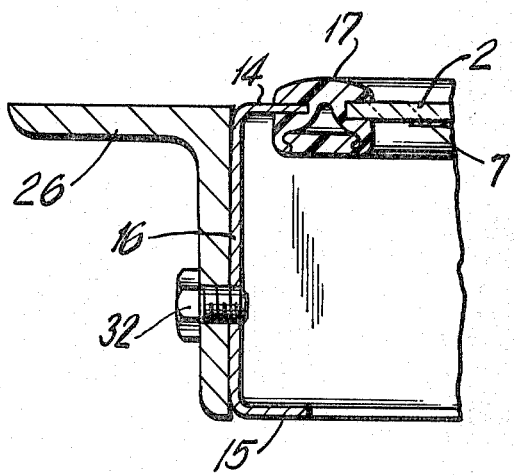
FIG. 4 is a fragmentary side elevation showing yet another alternate embodiment of the present invention.

As can be seen in FIGS. 2 and 3, encapsulant material 7, such as the silicone encapsulant typically employed, covers the entire underneath surface of the solar cells and extends substantially to the marginal edge of the support structure 2. Preferably the encapsulant 7, however, does not extend to the extreme edge of the support structure 2 for reasons which will become obvious upon continued reading of the description in conjunction with the drawings.

A junction box 8 is preferably bonded to the bottom of support structure 2 by means of the same adhesive used to apply the solar cells to the bottom of support structure 2. The junction box serves as a mounting means and as a housing for the terminal posts 31. The terminal posts 31, of course, also are used to operatively connect the solar cells to an external load. Additionally, the junction box serves as a receptacle for location of other electronic packages as may be required or desired.

The array of solar cells supported on the underneath surface of the support structure 2 along with the electrical termination posts 31 will hereinafter be referred to as the solar panel.

Extending around the perimeter of the solar panel is a rigid frame 9 composed of two longitudinal members and two side members. All of the individual frame members, longitudinal and side, are identically formed so that the different parts of the frame can be cut from a long strip of preformed stock. The ends of the frame members preferably are mitered as shown in FIG. 1 and are securely fixed together in any suitable manner such as by welding. The frame may be fabricated from sheet metal, extrusions or glass reinforced structural plastics and the like. The frame 9 is substantially U-shaped and transverse in cross-section and has inwardly extending upper flange 14 and an inwardly extending lower flange 15 and a vertical side wall 16. The two flanges 14 and 15 are generally of the same width although it is not necessary that the flanges be of exactly the same width. As indicated, both of the flanges extend inwardly and are positioned such that the upper flange 14 is essentially coplanar with the support structure 2 of the solar panel.

It is a feature of the invention that a setting strip 17 be provided which extends entirely around the perimeter of the support structure 2. The setting strip is formed from a resilient material such as silicon rubber or synthetic elastomer and the like and has flanges or arms 18, 19, 20 and 21, pairs of which flanges extend outwardly, embracing the upper flange 14 of the frame 9 on one side of the setting strip and the perimeter of the support structure 12 on the other side of the setting strip 17. The distance between each pair of arms is such that the space between the arms will be generally less than the thickness of the support structure such that when the setting strip is in place each pair of arms will firmly grip and hold the frame and the support structure and provide a firm, water-tight seal. The width of the setting strip 17 is greater than the space between the perimeter edge of the support structure 12 and the edge of the flange 14 when they are positioned for mounting on the support structure and the frame so that the setting strip must be compressed and the support structure 12 is mounted in the frame and operatively connected by the setting strip. As can be seen in the Figures, it is particularly preferred that the setting strip 17 have a central channel 22 into which channel a portion of the setting strip 17 may be further compressed, particularly during mounting of the support structure into the frame. This setting strip 17 serves a number of significant functions in that it provides a load path between the support structure 2 and the frame 9. It provides protection so that the support structure 2 cannot be edge loaded, particularly by impact. In view of the fact that the setting strip 17 is resilient, it also serves to provide a shock absorbing function to allow slight vertical movement of the whole panel and, of course, it provides a means of field mounting and demounting the panel assembly without removing or altering the frame.

As can be seen in FIGS. 1 and 2, the frame 9 also serves conveniently as a support for strain relief bracket 23 which can be bolted, welded or punch formed as desired to the vertical wall 16 of the frame. Thus, the output cable 24 from the junction box 8 can be fixed to an appropriate plug-in interconnector or strain relief mounted in strain relief bracket 23.

As is shown in the embodiment in FIG. 3, bottom flange 15 of the frame 9 serves most conveniently as the strain relief for the plug-in output connector 25 mounted through an appropriate opening in the flange 15 of the frame 9.

The vertical side wall 16 of frame 17 also serves as a means for bolting the modules one to the other or to appropriate standards. As is shown, for example, in FIG. 4, the vertical side wall 16 of frame 9 also serves as a means for bolting a right angle mounting member 26 to the frame via bolt 32.

Figure 5:
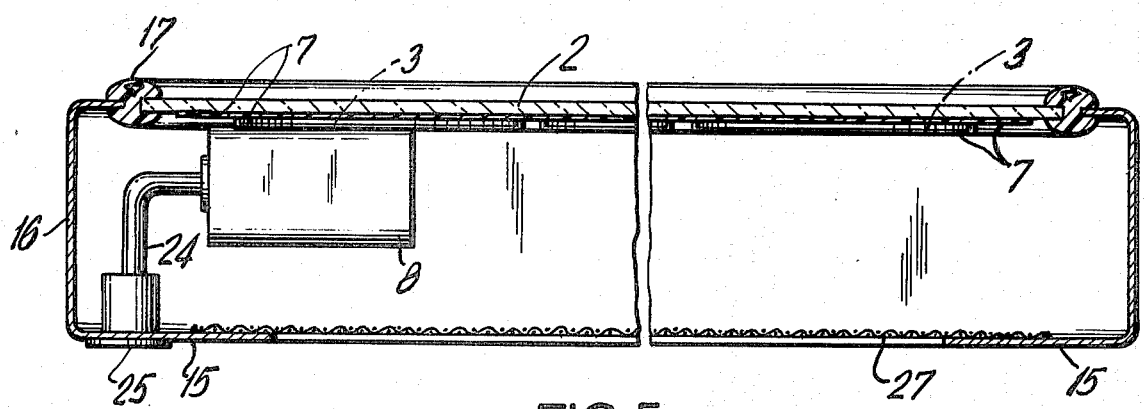
FIG. 5 is a fragmentary side elevation showing an additional feature of this invention.

In those instances where it is necessary to protect the back of the solar panel from animals and the like, an air permeable backing member, such as a wire mesh or screening shown generally as 27 in FIG. 5, can be permanently bonded to flanges 15 of the frame 9, thereby completely covering the back opening of the frame with a protective screening which will permit circulation of air through to the solar cells. Optionally, a perforated plate (not shown) may be mounted as a protective backing member in lieu of the screening 27 of FIG. 5. As will be readily appreciated, the protective screen or plate may be integral with the frame, if so desired.

What is claimed is:

1. A solar cell module comprising:
   a rigid, light transparent sheet having a top surface and a bottom surface;
   a plurality of silicon solar cells arrayed on the bottom surface of said sheet and bonded thereto by a silicon encapsulant;
   a junction box bonded to the bottom surface of said sheet;
   interconnecting means operatively interconnecting said silicon solar cells and terminating in said junction box;
   a rigid frame extending around the perimeter of said sheet for supporting said sheet, said frame having at least one flange extending inwardly, said inwardly extending flange being essentially coplanar with said sheet for supporting engagement with a setting strip and a setting strip of resilient material interconnecting said sheet and said frame, said setting strip having parts embracing the flange and marginal edge of said sheet.

2. The solar cell module of claim 1 wherein said frame has top and bottom inwardly extending flanges, said top flange being in essentially coplanar relation with said sheet for supporting engagement with the setting strip.

3. The solar cell module of claim 2 wherein the frame is substantially U-shaped in cross-section.

4. The solar cell module of claim 3 wherein said rigid light-transparent sheet is glass.

5. The solar cell module of claim 4 wherein an output connector is operatively connected via an output cable to the junction box of said module and said output connector is mounted on said bottom flange of said frame, thereby providing strain relief between said junction box and said output connector.

6. The solar cell module of claim 4 wherein there is included a mounting bracket extending inwardly from the said frame and to which an output connector is mounted, said output connector being operatively connected to said junction box whereby strain relief is provided between said junction box and said output connector.

7. The module of claim 4 wherein said module includes an air permeable protective sheet backing member bonded to and extending from said lower flange of said frame.

8. The module of claim 7 wherein said protective member is selected from the group consisting of wire mesh, wire screen, and perforated plates.

9. The module of claim 4 wherein said module includes an integral protective backing member.

10. The module of claim 9 wherein said protective member is selected from the group consisting of wire mesh, wire screen, and perforated plates.

11. In a solar cell module having a light-transparent rigid panel on the bottom surface of which is mounted an array of interconnected solar cells, the improvement comprising:
 a frame for supporting said panel, said frame having a vertical side and an inwardly extending horizontal flange, said flange being essentially coplanar with said panel;
 a resilient material for joining adjacent edges of the panel and said frame, said resilient material having arms extending outwardly for embracing said inwardly extending flange of said frame and the perimeter of said support panel when they are in essentially coplanar position so as to hold said frame and said panel firmly.

12. The improvement of claim 11 wherein said setting strip has a longitudinal opening or channel in the body portion thereof and wherein the width of said setting strip is wider than the distance between the said flange of said frame and the perimeter of said panel when placed in essentially coplanar relationship, thereby holding the solar panel in the frame firmly.

* * * * *